(12) United States Patent
Xie et al.

(10) Patent No.: US 9,391,024 B2
(45) Date of Patent: Jul. 12, 2016

(54) MULTI-LAYER DIELECTRIC STACK FOR PLASMA DAMAGE PROTECTION

(71) Applicant: Applied Materials, Inc., Santa Clara, CA (US)

(72) Inventors: Bo Xie, San Jose, CA (US); Kang Sub Yim, Palo Alto, CA (US); Cheng Pan, San Jose, CA (US); Sure Ngo, Dublin, CA (US); Taewan Kim, San Jose, CA (US); Alexandros T. Demos, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/850,069

(22) Filed: Sep. 10, 2015

(65) Prior Publication Data
US 2016/0111373 A1    Apr. 21, 2016

Related U.S. Application Data (60) Provisional application No. 62/064,396, filed on Oct. 15, 2014.

(51) Int. Cl.
| | | |
|---|---|---|
| *H01L 23/58* | (2006.01) | |
| *H01L 21/31* | (2006.01) | |
| *H01L 23/532* | (2006.01) | |
| *H01L 21/02* | (2006.01) | |
| *H01L 21/768* | (2006.01) | |

(52) U.S. Cl.
CPC .... *H01L 23/53295* (2013.01); *H01L 21/02126* (2013.01); *H01L 21/02203* (2013.01); *H01L 21/02274* (2013.01); *H01L 21/02348* (2013.01); *H01L 21/76825* (2013.01); *H01L 21/76832* (2013.01); *H01L 21/76838* (2013.01)

(58) Field of Classification Search
CPC .................. H01L 23/53295; H01L 21/02126; H01L 21/02203; H01L 21/02274; H01L 21/02348; H01L 21/76825; H01L 21/76832; H01L 21/76838
USPC .......................................... 257/638; 438/781
See application file for complete search history.

(56) References Cited

U.S. PATENT DOCUMENTS

| | | | |
|---|---|---|---|
| 9,054,110 B2 * | 6/2015 | Liou ................ | H01L 23/53238 |
| 2004/0018717 A1 | 1/2004 | Fornof et al. | |
| 2006/0091559 A1 | 5/2006 | Nguyen et al. | |
| 2008/0048148 A1 | 2/2008 | Borovik et al. | |
| 2011/0006406 A1 | 1/2011 | Urbanowicz et al. | |

FOREIGN PATENT DOCUMENTS

JP    2013-140980 A    7/2013

OTHER PUBLICATIONS

International Search Report Dated Dec. 22, 2015, for application No. PCT/US2015/048956.

\* cited by examiner

*Primary Examiner* — Tu-Tu Ho
(74) *Attorney, Agent, or Firm* — Patterson & Sheridan, LLP (57) ABSTRACT

Embodiments of the disclosure generally provide multi-layer dielectric stack configurations that are resistant to plasma damage. Methods are disclosed for the deposition of thin protective low dielectric constant layers upon bulk low dielectric constant layers to create the layer stack. As a result, the dielectric constant of the multi-layer stack is unchanged during and after plasma processing.

20 Claims, 4 Drawing Sheets

|  | k value | Porosity (%) | Thickness (Å) | Elastic Modulus (Gpa) | Hardness (Gpa) |
|---|---|---|---|---|---|
| Layer 111 | 2.50 | 25 | 2000 | 7.2 | 1.5 |
| Layer 112A | 2.75 | 12 | 100 | 9.6 | 2.2 |
| Layer 112B | 2.82 | 10 | 100 | 11.4 | 2.7 |

FIG. 3

MULTI-LAYER DIELECTRIC STACK FOR PLASMA DAMAGE PROTECTION

CROSS-REFERENCE TO RELATED APPLICATIONS

This application claims benefit of U.S. provisional patent application Ser. No. 62/064,396, filed Oct. 15, 2014, which is hereby incorporated herein by reference.

BACKGROUND OF THE DISCLOSURE

1. Field of the Disclosure

The present disclosure generally relates to the fabrication of integrated circuits that include multi-layer dielectric stacks that contain one or more low-k dielectric layers.

2. Description of the Related Art

Generally, semiconductor devices include a plurality of circuits which form an integrated circuit (IC) fabricated on a semiconductor substrate. A complex network of signal paths will normally be routed to connect the circuit elements distributed on the substrate. Efficient routing of these signals across the device requires formation of multi-level or multi-layered schemes, such as, for example, single or dual damascene wiring structures. The wiring structure typically includes copper (Cu), since Cu based interconnects provide higher speed signal transmission between large numbers of transistors on a complex semiconductor chip as compared with aluminum (Al) based interconnects.

Within a typical interconnect structure, metal vias run perpendicular to the semiconductor substrate and metal lines run parallel to the semiconductor substrate. Further enhancement of the signal speed and reduction of interfering signals in adjacent metal lines (known as "cross-talk") are achieved in today's IC product chips by embedding the metal lines and metal vias (e.g., conductive features) in a dielectric material having a dielectric constant (k) of less than 3.0 (low-k). More recently low-k dielectrics comprising organosilicon layers have been developed with k values less than about 3.0, and even less than about 2.5.

One method that has been used to develop low-k organosilicon layers has been to deposit the layers from a gas mixture comprising one or more organosilicon compounds and one or more organic porogen compounds. Herein, an organosilicon matrix is produced in which the porogen molecule is trapped. The porogen molecule is thermally labile and may contain volatile chemical groups. Thermal and/or ultraviolet (UV) radiation may be subsequently used to remove the porogens and/or volatile groups from the deposited layers to create nanometer-sized pores or voids in the layers. The presence of pores or voids lowers the dielectric constant of the layers, as air has a dielectric constant of approximately 1.

However, the porous low-k layers described above may be susceptible to damage during subsequent semiconductor processing steps that involve energetic plasma. One result of plasma damage is an increase in the dielectric constant of the dielectric layers, which in turn can increase parasitic capacitance and cross-talk between adjacent copper lines. An example of a damaging plasma processing step involves the deposition of a barrier layer, such as a cobalt metal cap or dielectric layer over or upon the copper lines, which may be used to prevent the electromigration (EM) of copper from adjacent copper lines. Electromigration may cause short circuits between lines, as well as void formation within a line or at an interface, which may lead to an open circuit.

Electromigration is one of the main reliability concerns for very large scale integrated (VLSI) circuits and manufacturing, and plasma deposition of barrier layers is typically used to help prevent EM in copper lines in most devices today. Therefore, there is a need for a method of forming one or more low-k layers and then protecting the formed low-k layers from plasma damage during the barrier layer deposition process, and thereby maintain the overall dielectric constant of the multi-layer dielectric stack or structure.

SUMMARY OF THE DISCLOSURE

Embodiments of the disclosure generally relate to methods for depositing a multi-layer stack that includes thin protective low dielectric constant layers upon and over a bulk low dielectric constant layer, wherein the protective layers prevent plasma damage to the bulk low dielectric constant layer in subsequent plasma processing steps. As a result, the dielectric constant of the multi-layer stack is unchanged after plasma exposure. Further embodiments disclose plasma damage resistant multi-layer dielectric stack configurations.

Embodiments of the disclosure further provide a method of depositing upon a substrate a first layer having a first thickness, wherein the first layer is formed by delivering one or more organosilicon compounds and one or more porogens in the presence of RF power in a processing region of a plasma chamber, depositing a second layer over the first layer, wherein the second layer has a second thickness that is less than the first thickness. The second layer may be formed by delivering one or more organosilicon compounds and one or more porogens in the presence of RF power in the processing region, and then exposing the second layer to a UV radiation, wherein a porous cross-linked multi-layer dielectric stack is produced, and the porogen is removed from the first layer and second layer.

Embodiments of the disclosure may further provide a method of depositing upon a substrate a first layer having a first thickness between about 550 Å to about 3000 Å, wherein the first layer is formed by delivering one or more organosilicon compounds and one or more porogens in the presence of RF power, and the first layer is formed in a processing region of a plasma chamber, depositing a second layer over the first layer, wherein the second layer has a thickness that may be between about 50 Å to about 500 Å. The second layer may be formed by delivering one or more organosilicon compounds and one or more porogens in the presence of RF power in the processing region, exposing the second layer to an ultraviolet radiation, wherein a porous cross-linked multi-layer dielectric stack is produced, and the porogen is removed from the first layer and second layer.

Embodiments of the disclosure may further provide a multi-layer dielectric stack, comprising a first layer that is disposed on a substrate, wherein the first layer comprises a porous cross-linked organosilicon network layer that has a first thickness between about 550 Å and about 3000 Å, a porosity, and a dielectric constant, and a second layer disposed over the first layer, wherein the second layer comprises a porous cross-linked organosilicon network layer that has a thickness between about 50 Å and about 500 Å, and wherein a porosity of the second layer is less than the porosity of the first layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of the disclosure and are therefore not to be considered limiting of its scope, for the disclosure may admit to other equally effective embodiments.

DETAILED DESCRIPTION

The present disclosure provides methods and embodiments for depositing a multi-layer stack that includes protective thin low-k layers upon a thicker bulk low-k layer, wherein the thin layers prevent plasma damage to the bulk layer during one or more subsequent plasma processing steps. The protective thin layers may feature a higher density, higher modulus, higher hardness and a lower porosity than the bulk layer, and are thus more resistant to plasma damage. The overall dielectric constant (k) value of a multi-layer dielectric stack thus configured is advantageously preserved during and after plasma processing.

One example of a process that may damage an unprotected bulk dielectric layer is the deposition of a barrier layer, such as metal capping layers or dielectric layers disposed upon and/or over copper signal lines, which may be used to prevent the electromigration (EM) of copper and/or as an etch stop. The deposition of cobalt metal caps, such as Applied Material's Volta™ cobalt, or dielectric barriers such as Applied Material's BLOk™ silicon carbide upon and/or over copper lines, involves the exposure of the exposed dielectric material to a plasma used for pre-cleaning (e.g., copper oxide cleaning and metal reduction) and/or barrier layer deposition processes. These processes are typically highly energetic, which necessitates the protection of the exposed low-k dielectric layer(s), since the electrical and physical properties of the exposed low-k dielectric layer(s) may become degraded by the exposure to the plasma. Respective examples for barrier layer deposition systems include the Applied Endura® Volta™ CVD (chemical vapor deposition) Cobalt system and the Applied Producer® BLOk™ PECVD (plasma enhanced chemical vapor deposition) system, both available from Applied Materials, Inc., located in Santa Clara, Calif. Further method details are found later in the disclosure.

Low-k dielectric layers in the embodiments of the disclosure are deposited from a gas mixture comprising one or more organosilicon compounds and one or more organic porogen compounds. Herein, an organosilicon matrix is produced in which the porogen molecule is trapped. The porogen molecule is thermally labile or contains volatile chemical groups. Thermal and/or UV radiation may be subsequently used to remove the porogens and/or volatile groups from the deposited layers to create nanometer-sized pores or voids in the layers, which lowers the dielectric constant of the layers, as air has a dielectric constant of approximately 1. After exposure to heat or UV radiation, embodiments of the disclosure provided herein may provide porous low-k layers that generally comprise of a cross-linked network further comprising air voids and silicon-oxygen, silicon-carbon, and carbon-hydrogen chemical bonds.

Figure 1A:
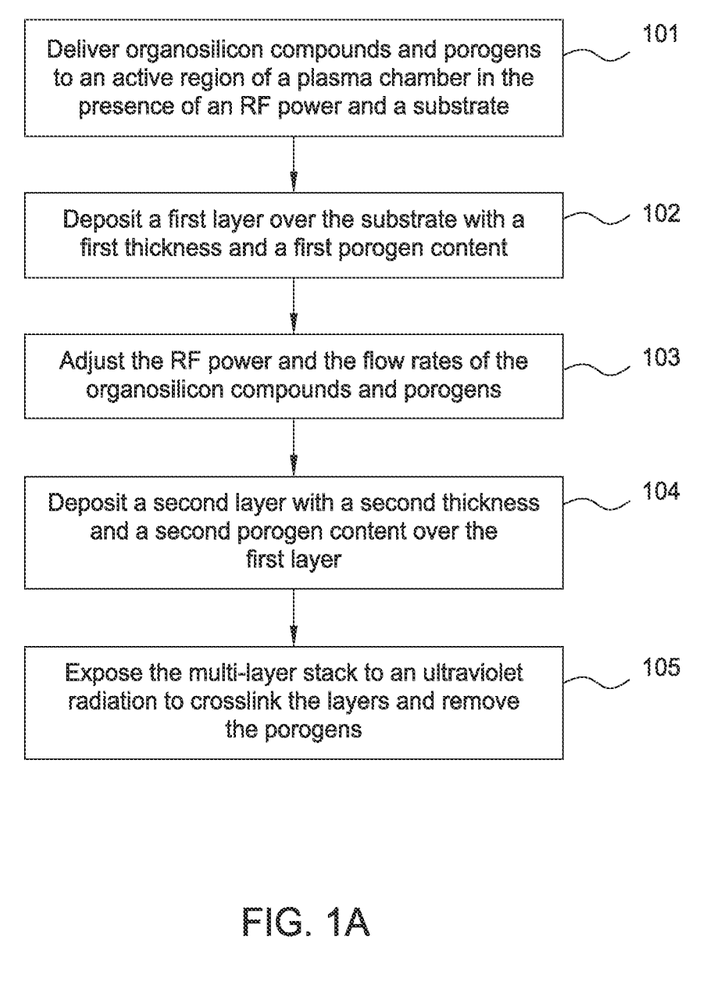
FIG. 1A is a flowchart depicting steps associated with a method of forming at least part of a multi-layer stack, according to an embodiment of the disclosure.
Figure 1B:
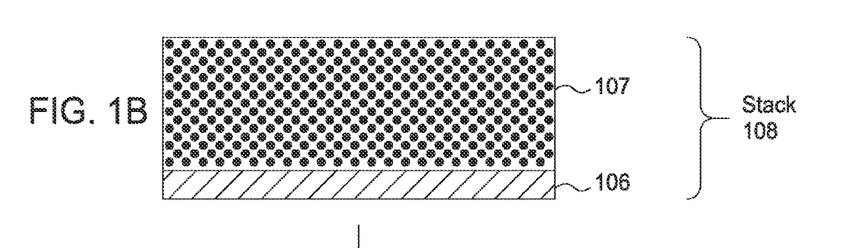
FIGS. 1B-1D illustrate cross-sectional views representing portions of the deposition method set forth in FIG. 1A, according to an embodiment of the disclosure.
Figure 1C:
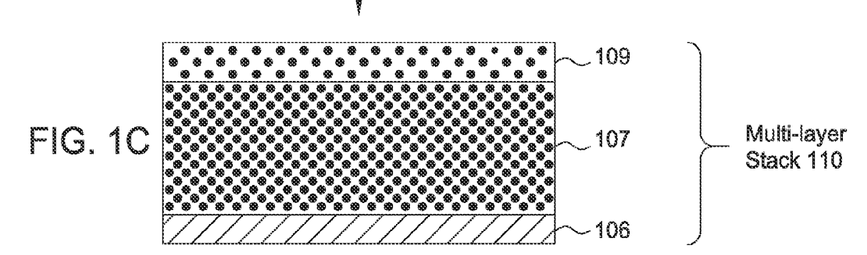
Figure 1D:
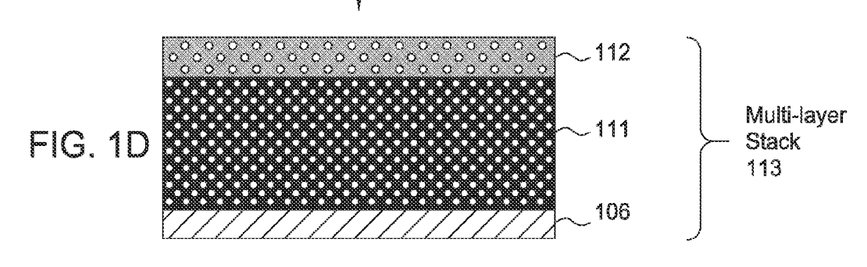

FIG. 1A is a flowchart depicting steps associated with a deposition method 100 used to form one or more low-k layers according to embodiments of the disclosure. FIGS. 1B-1D illustrate cross-sectional views representing one or more portions of the deposition method as set forth in FIG. 1A, and graphically illustrate various stages of the method 100. At the beginning of the method 100, per box 101, one or more organosilicon compounds and one or more porogens are provided to a plasma chamber in the presence of a first RF power, and wherein a substrate 106 resides on a temperature controlled substrate holder or electrostatic chuck. The substrate 106 may be equilibrated to and maintained at a temperature between about 200 and about 350° C. during processing. An example of a plasma chamber that may be used is an Applied Producer® chamber for depositing Black Diamond® layers, available from Applied Materials, Inc. of Santa Clara, Calif. However, other chambers may be used to deposit the low-k dielectric layers. Further method and hardware related details are discussed below.

Next at box 102 of FIG. 1A, and as illustrated in corresponding FIG. 1B, a low-k organosilicon layer 107 (bulk low-k layer 107), having a first thickness is deposited upon the substrate 106 in the presence a first RF power and a first flow rate of organosilicon and porogen precursors, to create a stack 108. Next at box 103 of FIG. 1A, the RF power and flow rates of the organosilicon and porogen compounds are lowered prior to box 104. The processes performed during box 104 include the controlled deposition of a protective low-k layer 109, which may be thinner than the bulk low-k layer 107, thereby yielding a multi-layer stack 110, as shown in FIG. 1C.

Next, at box 105, and as illustrated in FIGS. 1C and 1D, the multi-layer stack 110 is cured by use of a curing process, such as exposing 110 to UV radiation. The combination of heat and UV radiation cross-links the organosilicon network and removes the porogen from both bulk low-k layer 107 and protective low-k layer 109. Notably, the protective low-k layer 109 is sufficiently thin and porous to allow the porogens to out-gas and be removed from the underlying bulk low-k layer 107, while still maintaining desirable electrical and mechanical properties, and a resistance to plasma damage during any subsequent plasma processing steps. Therefore, as a result of UV exposure and loss of the porogen material, layers 107 and 109 are transformed into a bulk low-k layer 111 and a protective low-k layer 112, respectively, which each comprise a material layer that includes voids or pores that contain air. The bulk low-k layer 111 and protective low-k layer 112 form at least part of the multi-layer dielectric stack 113, which is illustrated in FIG. 1D. The FIG. 3 table compares the unique properties of the post-UV exposed bulk low-k layer 111 and protective low-k layer 112, and highlights the differences between the layers including dielectric constant, porosity, modulus, and hardness. An example of a commercially available UV chamber that may be used for low-k dielectric layers is the Applied Producer® Nanocure™ chamber from Applied Materials, Inc. Further method details are found later in this disclosure.

After performing the processes illustrated in box 105, the multi-layer dielectric stack 113 is then further processed to form at least part of an integrated circuit formed within an electronic device. This typically involves dual and/or single-Damascene processing, generally comprising of the following steps: photoresist deposition and patterning upon and over a low-k dielectric, etching the dielectric to create vias and trenches, deposition of a thin barrier layer over the formed trench and via topography to prevent copper migration, copper seed deposition, then followed by copper electroplating and chemical mechanical planarization.

After planarization, residual copper oxides are removed via reductive plasma treatments to create a clean metallic copper surface, upon which cobalt and dielectric barrier layers, such as amorphous silicon carbide barrier layers may be deposited to prevent copper electromigration and/or serve as an etch stop. As an example, cleaning a contaminated copper surface may include exposure of the copper to a reducing agent in the presence of an RF plasma, wherein the reducing agent may comprise of nitrogen, ammonia, hydrogen, an ammonia/nitrogen mixture, or combinations thereof. The metallic copper surface thus obtained may be further exposed to a cobalt containing chemical reagent such as cyclopentadienyl cobalt bis(carbonyl) between about 200° C. and about 350° C. to effect the selective chemical vapor deposition of cobalt metal on the copper surface or feature. Further steps may comprise of alternating cobalt deposition and reductive plasma treatment cycles performed 2, 3, or more times to deposit multiple metallic cobalt capping layers within a range from about 3 Å to about 5 Å during each of the cycles. Another step may include the deposition of a dielectric barrier layer such as amorphous silicon carbide (ex. Applied Materials BLOk™) over and upon the cobalt capped copper lines.

Next, referring back to box 102 in more detail, the deposition parameters for the bulk low-k layer 107 are in contrast to those of the second protective low-k layer 109, and generally involve higher RF power and deposition rates of the one or more organosilicon compounds and the one or more porogens. For example, the bulk low-k layer 107 may be deposited in the presence of an RF power between about 50 W and about 900 W, and from between about 750 W and about 900 W. The deposition rate for bulk low-k layer 107 may be from between about 3000 Å and about 4500 Å per minute, yielding layer thicknesses between about 550 Å and about 3000 Å, and between about 1000 Å and about 2500 Å.

Referring back to boxes 103 and 104, the process parameters used to form the bulk low-k layer 107 are adjusted to form the protective low-k layer 109. For example, in some embodiments, an RF power five times lower or less is used to deposit the protective low-k layer 109, in comparison to the RF power used to deposit bulk low-k layer 107. Therefore, protective low-k layer 109 may be deposited in the presence of an RF power between about 50 W and about 200 W, and between about 100 W and about 175 W. In other words, the ratio of the average RF power used during a first deposition process used to form the bulk low-k layer 107 and used during a second deposition process used to form the protective low-k layer 109 is about 5:1 or greater. The deposition rate of protective low-k layer 109 may be lower than bulk low-k layer 107 because the thickness of the protective layer 109 is one fourth of the bulk low-k layer 107 or less, comprising a thickness ratio of about 1:4 or less. For example, deposition rates for protective low-k layer 109 may be between about 500 Å per minute and about 1300 Å per minute, and layer thicknesses may be between about 50 Å and about 500 Å. In one example, a ratio of a deposition rate of a first deposition process used to form the bulk low-k layer 107 to a deposition rate of a second deposition process used to form the protective low-k layer 109 is about 2.6:1 or greater As discussed prior, the differences in deposition parameters yield a multi-layer dielectric stack 113, that includes a substrate 106 and the post-UV exposed layers 111 and 112, wherein, and most advantageously, the overall dielectric constant of multi-layer dielectric stack 113 remains unchanged during and after subsequent plasma processing.

Figure 2:
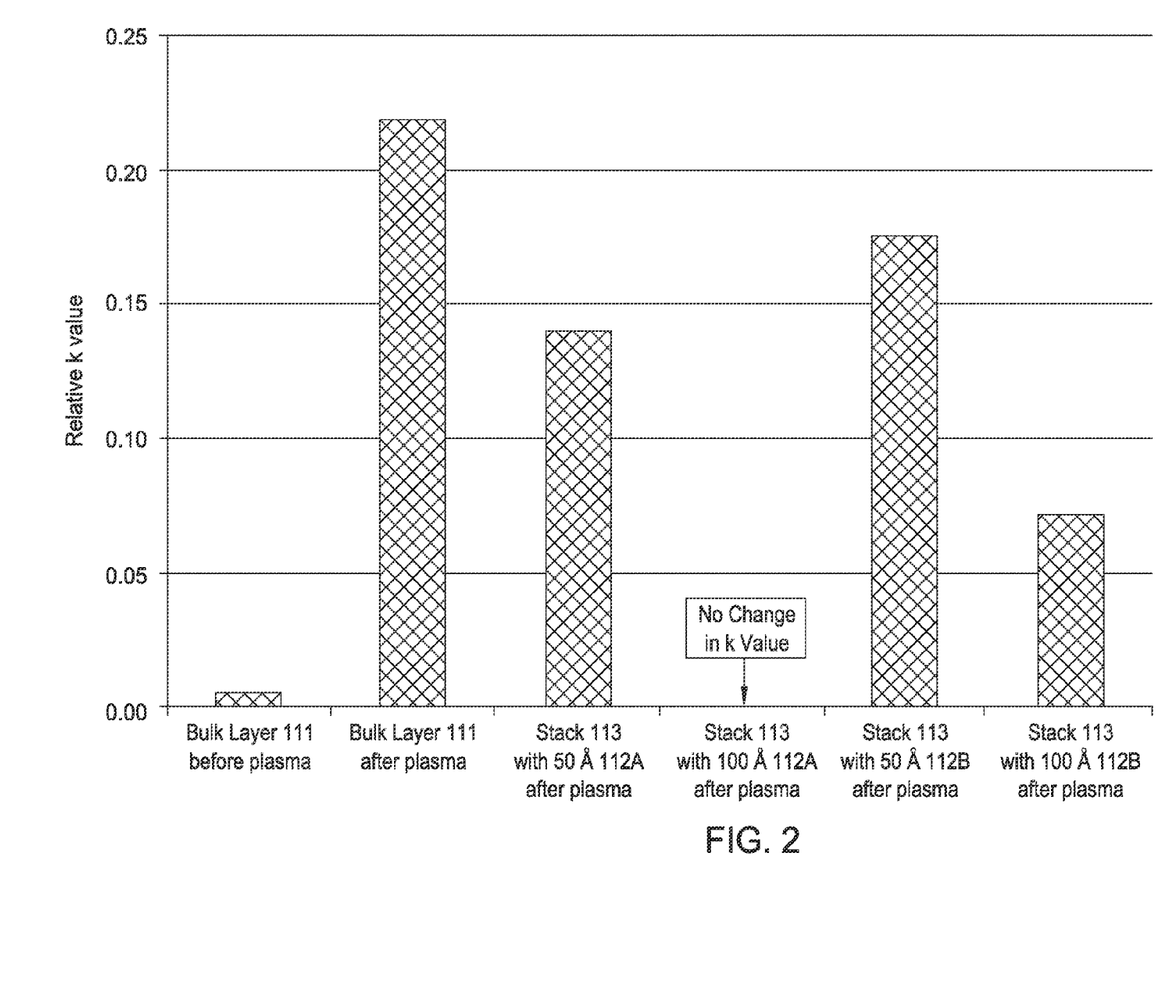
FIG. 2 graphically illustrates the changes in dielectric constant (k) values for layers and multi-layer dielectric stacks before and after plasma processing, according to embodiments of the disclosure.

As shown in FIG. 2, significant advantages are realized from using a protective low-k dielectric layer disposed upon or over a bulk low-k dielectric layer. As illustrated, bulk low-k layer 111, without the protective low-k layer 112, exhibits a relative increase in k value of 22% when exposed to plasma conditions used to form a barrier layer, such as a metal capping layer. In contrast, the relative k value of the multi-layer dielectric stack 113, comprised of bulk low-k layer 111 and protective low-k layer 112A, increases by only 14% when the protective low-k layer 112A is 50 Å thick. Notably, and also shown in FIG. 2, no detectable increase in overall k value is detected after exposing the protective low-k layer 112A to a plasma (e.g., barrier layer formation steps) when the protective low-k layer 112A comprises 100 Å of thickness. Also shown in FIG. 2 is the relative change in k value for multi-layer dielectric stack 113 comprising protective low-k layer 112B, wherein 112B comprises 50 Å of thickness and 100 Å of thickness. Herein the same trend is observed, where the relative respective increases in k value are 18% and 7%, versus 22% for the unprotected bulk low-k layer 111. Per above, we note that the deposition parameters for protective low-k layer 112A differed from protective low-k layer 112B by a deposition rate 1.6 times lower, and a porogen flow rate 2 times higher, so as to control and maintain layer thickness and layer dielectric constant after porogen removal.

Figure 3:
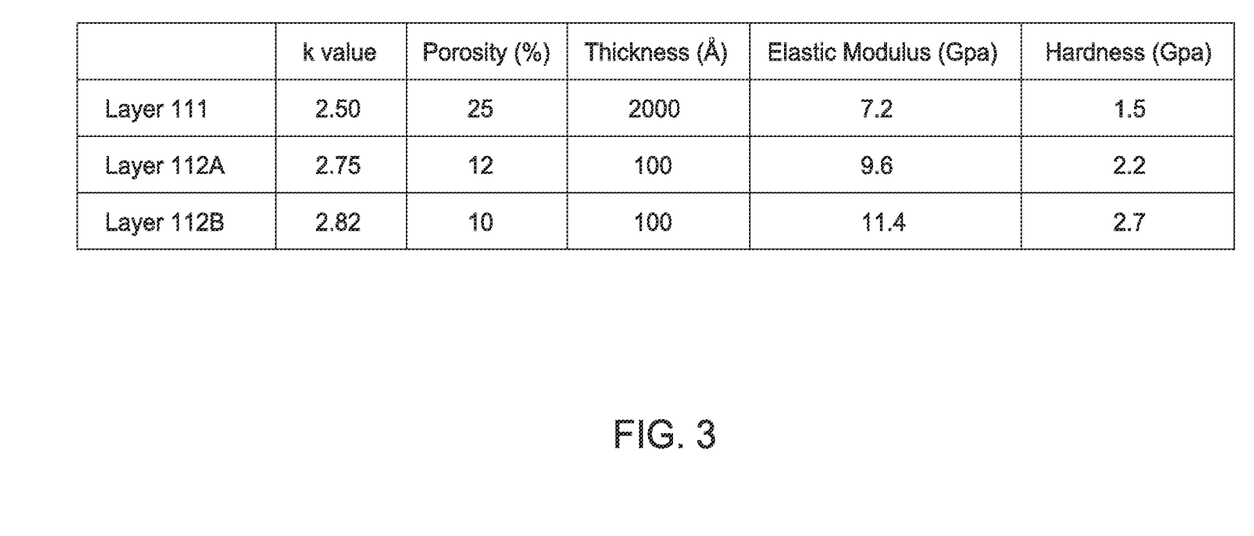
FIG. 3 is a table of physical properties for some formed dielectric layers using one or more of the embodiments of the disclosure provided herein.

FIG. 3 summarizes in tabular form some exemplary properties for the bulk porous low-k layer 111 and protective low-k layers 112A and 112B, which can each be separately formed over or directly on the bulk porous low-k layer 111. As shown, and in contrast to bulk porous low-k layer 111, the protective layers comprise of higher dielectric constants, lower porosities, and further include a material that has a higher elastic modulus and a higher hardness value.

It is believed that the higher modulus and hardness values of the formed protective low-k layer 112A or 112B may also solve a common problem found with conventional multi-layer dielectric stacks, which include porous low-k layers, during subsequent semiconductor processing steps. Conventional porous low-k layers, which are subsequently processed, may feature reduced or compromised mechanical properties such as elastic modulus, hardness, and fracture toughness because of the introduction of porosity and voids in the formed layers. Because of the reduced mechanical properties, any significant stress induced in the formed layers during subsequent semiconductor process steps, such as chemical mechanical planarization, may cause the cracking, delamination and/or structural failure of the formed low-k layers. However, in embodiments of this disclosure, the stiffer and harder protective low-k layers 112A and 112B, which are disposed upon or over a more fragile and more porous bulk low-k layer 111, will prevent thermal and mechanical damage from occurring to the bulk porous low-k layer 111, and thus further protect the integrity of the multi-layer dielectric stack 113.

In some embodiments, another benefit may be realized in relation to the thickness of the protective low-k layer 112A or 112B disposed upon and over the bulk low-k layer 111. The protective layers may be deposited at thicknesses between about 50 Å and about 500 Å, without raising the overall k value of the multi-layer dielectric stack. For example, protective low-k layer 112A or 112B is at least 50 Å thick without raising the overall k value of the multi-layer dielectric stack. In another example, protective low-k layer 112A or 112B is at least 100 Å thick without raising the overall k value of the multi-layer dielectric stack. It is believed that a denser, less porous and higher dielectric constant protective low-k layer, comprised of a thickness that is less than a bulk low-k layer, and comprising a thickness ratio of about 1:4 or less, uniquely may not raise the overall dielectric constant of a multi-layer stack, and thus may not increase parasitic capacitance and cross-talk between adjacent copper lines.

Additionally, with respect to the layer thicknesses discussed above, the protective low-k layer 109 porosity should be sufficient for the effusion of porogen from the underlying bulk low-k layer 107, and thus not block the effusion or outgassing of porogen from underlying bulk low-k layer 107 when exposed to UV radiation and heat, and wherein the porosity of protective low-k 109 may be about 5% or greater to permit the effusion of porogen from underlying bulk low-k layer 107. In one example, the porosity of protective low-k 109 may be between about 1% and about 25% to permit the effusion of porogen from underlying bulk low-k layer 107. In another example, the porosity of protective low-k 109 may be between about 5% and about 12% to permit the effusion of porogen from underlying bulk low-k layer 107. In yet another example, the ratio of the porosity of protective low-k 109 to the bulk low-k layer 107 is between about 0.4 and about 0.5. One will note that the thickness and average porosity of the protective low-k layer 112 (e.g., protective low-k layer 112A or 112B), which is disposed over or on the bulk low-k layer 111, are generally configured to assure that porogens disposed in the pre-cured bulk low-k layer 107 can diffuse through the protective low-k layer 109 during the processes performed in step 105. It is believed that forming protective low-k layers that have properties similar to either protective low-k layer 112A or 112B, as illustrated in table 3, will provide a multi-layer dielectric stack that has a desirable dielectric constant, mechanical properties, pore density and thickness.

Returning to boxes 101 to 105 of FIG. 1A in more detail, the chamber into which the one or more organosilicon compounds and one or more porogens are introduced may be a plasma enhanced chemical vapor deposition (PECVD) chamber. The plasma for the deposition process may be generated using constant radio frequency (RF) power, pulsed RF power, high frequency RF power, dual frequency RF power, or combinations thereof. An example of a PECVD chamber that may be used is an Applied Producer® Black Diamond® chamber, available from Applied Materials, Inc. of Santa Clara, Calif. However, other chambers may be used to deposit the low-k layers.

In some embodiments of the disclosure, the one or more organosilicon compounds are generally chosen from a group including siloxanes, silanols, silyl ethers, silanes, silyl hydrides, silylidenes, sylenes, silyl halides, siloles, and combinations thereof. The one or more organosilicon compounds may also comprise of methyldiethoxysilane (MDEOS), tetramethylcyclotetrasiloxane (TMCTS), octamethylcyclotetrasiloxane (OMCTS), trimethylsilane (TMS), pentamethylcyclopentasiloxane, hexamethylcyclotrisiloxane, dimethyldisiloxane, tetramethyldisiloxane, hexamethyldisiloxane (HMDS), 1,3-bis(silanomethylene)disiloxane, bis(1-methyldisiloxanyl)methane, bis(1-methyldisiloxanyl)propane, hexamethoxydisiloxane (HMDOS), dimethyldimethoxysilane (DMDMOS), or dimethoxymethylvinylsilane (DMMVS).

Porogens in the embodiments of the disclosure are generally compounds that are thermally labile and may comprise of thermally labile groups. The porogens and thermally labile groups may be cyclic groups, such as unsaturated cyclic organic groups. The term "cyclic group" as used herein is intended to refer to a ring structure. The ring structure may contain as few as three atoms. The atoms may include carbon, nitrogen, oxygen, fluorine, and combinations thereof, for example. The cyclic group may include one or more single bonds, double bonds, triple bonds, and any combination thereof. For example, a cyclic group may include one or more aromatics, aryls, phenyls, cyclohexanes, cyclohexadienes, cycloheptadienes, and combinations thereof. The cyclic group may also be bicyclic or tricyclic. In one embodiment, the cyclic group is bonded to a linear or branched functional group. The linear or branched functional group preferably contains an alkyl or vinyl alkyl group and has between one and twenty carbon atoms. The linear or branched functional group may also include oxygen atoms, such as in a ketone, ether, and ester. The porogen may comprise a cyclic hydrocarbon compound. Some exemplary porogens that may be used include norbornadiene (BCHD, bicycle(2.2.1)hepta-2, 5-diene), alpha-terpinene (ATP), vinylcyclohexane (VCH), phenylacetate, butadiene, isoprene, cyclohexadiene, 1-methyl-4-(1-methylethyl)-benzene (cymene), 3-carene, fenchone, limonene, cyclopentene oxide, vinyl-1,4-dioxinyl ether, vinyl furyl ether, vinyl-1,4-dioxin, vinyl furan, methyl furoate, furyl formate, furyl acetate, furaldehyde, difuryl ketone, difuryl ether, difurfuryl ether, furan, and 1,4-dioxin.

In some embodiments of the disclosure, involving the deposition of bulk low-k layer 107, the one or more organosilicon compounds flow rates may be between about 100 milligrams per minute (mg/min) and about 5000 mg/min, and between about 100 and about 5000 mg/min. For the deposition of protective low-k layer 109, the one or more organosilicon compounds the flow rates may be between about 100 mg/min and about 5000 mg/min, and between about 100 and about 5000 mg/min. The one or more porogens flow rates may be between about 100 mg/min and about 5000 mg/min, and between about 100 and about 5000 mg/min. Depending on the flow rates of the one or more organosilicon compounds and the one or more porogens, the layer depositions may have a time between about 15 seconds and about 500 seconds.

In some embodiments, an oxidizing gas, such as $O_2$, $N_2O$, $CO_2$, or combinations thereof, may be introduced into the chamber at a flow rate between about 50 sccm and about 500 sccm. A dilution or carrier gas, such as helium, argon, or nitrogen, may also be introduced into the chamber at a flow rate between about 500 sccm and about 3000 sccm. The oxidizing gas may be used to lower carbon and hydrogen content in the layers via oxidation, which will affect the mechanical and electrical properties of the protective low-k layer 112 and bulk low-k layer 111.

Returning to boxes 101-104 of FIG. 1A in more detail, the substrate is typically maintained at a temperature between about 200° C. and about 350° C. during the deposition. The chamber pressure may be between about 1 Torr and about 20 Torr, and between about 5 Torr and about 10 Torr. The spacing between a substrate support and the chamber showerhead may be between about 200 mils and about 1500 mils. The RF power is provided at a frequency between about 0.01 MHz and about 300 MHz, such as about 13.56 MHz. The RF power may be provided at a mixed frequency, such as at a high frequency of about 13.56 MHz and a low frequency of about 350 kHz. The RF power may be cycled or pulsed to reduce heating of the substrate and promote greater porosity in the deposited layer.

Referring to box 105 of FIG. 1A, and as illustrated in FIGS. 1C and 1D, bulk low-k layer 107 and protective low-k layer 109 may be exposed to UV radiation and other post-treatments for porogen removal. Generally, for the embodiments of the disclosure, post-treatments that may be used include electron beam (e-beam) treatments, UV treatments, thermal annealing treatments (in the absence of an electron beam and/or UV treatment), and combinations thereof. Exemplary UV post-treatment conditions that may be used include a chamber pressure of between about 1 Torr and about 10 Torr and a substrate support temperature between about 250° C. and about 400° C. The thermal treatments may be used to increase porogen removal amount and a rate of porogen removal.

The UV radiation may be provided by any UV source, such as mercury microwave arc lamps, pulsed xenon flash lamps, or high-efficiency UV light emitting diode arrays. The UV radiation may have a wavelength between about 170 nm and about 400 nm. In one embodiment, the multilayer stack 110 is exposed to UV radiation such as about 60-600 seconds to cross-link and remove the porogens from both the layers. The Applied Producer® Nanocure™ chamber from Applied Materials, Inc. is an example of a commercially available chamber that may be used for UV post-treatments. However, other chambers may be used to perform UV exposure and treatment of low-k dielectric layers.

In some embodiments, thermal annealing post-treatment includes annealing the layers at a substrate temperature between about 200° C. and about 500° C. for about 2 seconds to about 3 hours, such as about 0.5 to about 2 hours, in a chamber. A non-reactive gas such as helium, hydrogen, nitrogen, or a mixture thereof may be introduced into the chamber at a rate of between about 100 and about 10,000 sccm. The chamber pressure is maintained between about 1 mTorr and about 10 Torr. The preferred substrate spacing may be between about 300 mils and about 800 mils.

While the foregoing is directed to embodiments of the present disclosure, other and further embodiments of the disclosure may be devised without departing from the basic scope thereof, and the scope thereof is determined the claims that follow.

What is claimed is:

1. A method of depositing a multi-layer dielectric stack, comprising:
   depositing upon a substrate a first layer having a first thickness, wherein the first layer is formed by delivering one or more organosilicon compounds and one or more porogens in the presence of RF power, and the first layer is formed in a processing region of a plasma chamber;
   depositing a second layer over the first layer, wherein the second layer has a second thickness that is less than the first thickness, and wherein the second layer is formed by delivering one or more organosilicon compounds and one or more porogens in the presence of RF power in the processing region; and
   exposing the second layer to an ultraviolet radiation, wherein a porous cross-linked multi-layer dielectric stack is produced, and the porogen is removed from the first layer and second layer.

2. The method of claim 1, wherein the ratio of the first thickness to the second thickness is 4:1 or greater.

3. The method of claim 1, wherein the porosity of the second layer is less than the porosity of the first layer.

4. The method of claim 1, further comprising:
   depositing a metal layer over the multi-layer dielectric stack using a plasma process, wherein the second layer protects the first layer from damage during the plasma process.

5. The method of claim 4, wherein a dielectric constant of the multi-layer stack is unchanged after the plasma process.

6. A method of depositing a multi-layer dielectric stack, comprising:
   depositing upon a substrate a first layer having a first thickness between about 550 Å to about 3000 Å, wherein the first layer is formed by delivering one or more organosilicon compounds and one or more porogens in the presence of RF power, and the first layer is formed in a processing region of a plasma chamber;
   depositing a second layer over the first layer, wherein the second layer has a thickness that is between about 50 Å to about 500 Å, and wherein the second layer is formed by delivering one or more organosilicon compounds and one or more porogens in the presence of RF power in the processing region; and
   exposing the second layer to an ultraviolet radiation, wherein a porous cross-linked multi-layer dielectric stack is produced, and the porogen is removed from the first layer and the second layer.

7. The method of claim 6, wherein the second layer porosity is between about 8% and about 15% after exposure to the ultraviolet radiation.

8. The method of claim 7, wherein a dielectric constant of the second layer is between about 2.6 and about 3 after exposure to the ultraviolet radiation.

9. The method of claim 6, wherein the porosity of the first layer is between about 20% and about 35% after exposure to the ultraviolet radiation.

10. The method of claim 6, wherein a dielectric constant of the first layer is between about 2.0 and about 2.6 after exposure to the ultraviolet radiation.

11. The method of claim 6, further comprising:
    depositing a metal layer over the multi-layer dielectric stack using a plasma process, wherein the second layer protects the first layer from damage during the plasma process.

12. The method of claim 11, wherein a dielectric constant of the multi-layer stack is unchanged after the plasma process.

13. A multi-layer dielectric stack, comprising:
    a first layer that is disposed on a substrate, wherein the first layer comprises a porous cross-linked organosilicon network layer that has a first thickness between about 550 Å and about 3000 Å, a porosity, and a dielectric constant; and
    a second layer disposed over the first layer, wherein the second layer comprises a porous cross-linked organosilicon network layer that has a thickness between about 50 Å and about 500 Å, and wherein a porosity of the second layer is less than the porosity of the first layer.

14. The multi-layer dielectric stack of claim 13, wherein the porosity of the first layer is between about 20% and about 35%.

15. The multi-layer dielectric stack of claim 13, wherein a dielectric constant of the first layer is between about 2.6 and about 2.0.

16. The multi-layer dielectric stack of claim 13, wherein the porosity of the second layer may be between about 8% and about 15%.

17. The multi-layer dielectric stack of claim 13, wherein a dielectric constant of the second layer is between about 3 and about 2.5.

18. The multi-layer dielectric stack of claim 13, wherein the second layer protects the first layer from damage from a plasma process.

19. The multi-layer dielectric stack of claim 18, wherein the plasma process comprises depositing a metal layer.

20. The multi-layer dielectric stack of claim 18, wherein a dielectric constant of the multi-layer stack is unchanged after the plasma process.

* * * * *